(12) United States Patent
Chen

(10) Patent No.: US 8,847,085 B2
(45) Date of Patent: Sep. 30, 2014

(54) POWER DEVICE

(71) Applicants: FSP Technology Inc., Taoyuan County (TW); 3Y Power Technology (Taiwan), Inc., Taoyuan County (TW)

(72) Inventor: Cheng-Hsuan Chen, Taoyuan County (TW)

(73) Assignees: FSP Technology Inc., Taoyuan County (TW); 3Y Power Technology (Taiwan), Inc., Taoyuan County (TW)

( * ) Notice: Subject to any disclaimer, the term of this patent is extended or adjusted under 35 U.S.C. 154(b) by 0 days.

(21) Appl. No.: 13/914,593

(22) Filed: Jun. 10, 2013

(65) Prior Publication Data

US 2013/0342979 A1 Dec. 26, 2013

(30) Foreign Application Priority Data

Jun. 11, 2012 (TW) .............................. 101120911 A

(51) Int. Cl.
*H05K 7/14* (2006.01)
*H05K 5/00* (2006.01)
*H02J 1/00* (2006.01)

(52) U.S. Cl.
CPC ............... *H05K 7/1401* (2013.01); *H02J 1/00* (2013.01); *H05K 7/1492* (2013.01); *Y10S 439/911* (2013.01)
USPC ............. 174/535; 174/50; 174/520; 439/535; 439/345; 439/911; 361/654; 361/672; 361/679.01

(58) Field of Classification Search
USPC ......... 174/50, 17 R, 520, 535, 559, 53, 72 A; 439/535, 372, 296, 345, 911, 373; 361/600, 601, 654, 652, 673, 609, 615, 361/672, 679.01, 679.02, 679.57, 679.58, 361/728, 729, 730, 732, 752, 759, 826, 726, 361/727, 802
See application file for complete search history.

(56) References Cited

U.S. PATENT DOCUMENTS

| | | | | |
|---|---|---|---|---|
| 5,949,652 | A * | 9/1999 | McAnally et al. | 361/726 |
| 6,439,917 | B2 * | 8/2002 | Tonozuka | 439/911 |
| 6,985,358 | B2 * | 1/2006 | Thompson et al. | 361/694 |
| 7,104,830 | B1 * | 9/2006 | Diaz | 439/372 |
| 7,199,491 | B2 * | 4/2007 | Novinsky et al. | 361/654 |
| 7,354,293 | B2 * | 4/2008 | Liang | 361/727 |
| 7,414,860 | B1 * | 8/2008 | Chen | 361/759 |
| 7,513,791 | B1 * | 4/2009 | Gary | 439/373 |
| 8,456,845 | B2 * | 6/2013 | Liu | 361/728 |
| 8,743,563 | B2 * | 6/2014 | Liang | 361/802 |

* cited by examiner

Primary Examiner — Angel R Estrada
(74) Attorney, Agent, or Firm — Jianq Chyun IP Office

(57) ABSTRACT

A power device suited for being assembled in a chassis and connected with a plug is provided. The power device includes a housing, and a receptacle, a spring clamp, a position limiting element disposed on the housing. The plug is removably connected to the receptacle. The spring clamp has a moving end. The position limiting element is located between the spring clamp and the receptacle. The position limiting element and the moving end of the spring clamp are linked together to move between a first position and a second position relative to the housing. When the plug connects to the receptacle, the position limiting element is interfered with the plug and the spring clamp simultaneously so that the spring clamp is constrained at the first position.

8 Claims, 3 Drawing Sheets

POWER DEVICE

CROSS-REFERENCE TO RELATED APPLICATION

This application claims the priority benefit of Taiwan application serial no. 101120911, filed on Jun. 11, 2012. The entirety of the above-mentioned patent application is hereby incorporated by reference herein and made a part of this specification.

BACKGROUND OF THE INVENTION

1. Field of the Invention

The invention relates to a power device, and more particularly to a power device having a security configuration.

2. Description of Related Art

In the modern era of prospering electronics industry, a variety of electronic apparatuses is accompanied by a power supply to provide power. In general, the main purpose of the power supply is to convert alternating current (AC) into a stable direct current (DC) power supply source required for a variety of electronic apparatuses.

Taking a server for example, the power supply is disposed in a server chassis conventionally, and the power supply is fixed in the chassis or disassembled from the chassis by pressing a spring clamp on the power supply. However, there is no security mechanism on the power supply structurally. When a plug is connected to the power supply receptacle and the power supply is still in operation at this moment, the chassis is pulled or the power supply is taken from the chassis by people recklessly, which occurs oftentimes. Operation of the power supply is interrupted at this time, thus leading to accidents or causing damage to the power supply or related electronic apparatuses.

SUMMARY OF THE INVENTION

The invention provides a power device including a security configuration to prevent accidents.

The invention provides a power device suited for being assembled in a chassis and connected with a plug according to an embodiment of the invention. The power device includes a housing on which a receptacle, a spring clamp and a position limiting element are disposed. The plug is removably connected to the receptacle. The spring clamp includes a moving end. The position limiting element is located between the spring clamp and the receptacle. The position limiting element and the moving end of the spring clamp are linked together to move between a first position and a second position as relative to the housing. When the plug is connected to the receptacle, the position limiting element interferes the plug and the spring clamp at the same time to constrain the spring clamp at the first position.

In an embodiment of the invention, as the moving end of the spring clamp moves from the first position to the second position, the moving end drives the position limiting element to move from a third position to a fourth position. When the plug is connected to the receptacle, the plug essentially constrains the position limiting element at the third position.

In an embodiment of the invention, the first position and the second position of the moving end, the third position and the fourth position of the position limiting element and the plug are on a same path. When the plug is connected to the receptacle, the plug essentially constrains the position limiting element between the third position and the fourth position.

In an embodiment of the invention, a grip is further included and disposed on the housing. The position limiting element is movably sleeved on the grip.

In an embodiment of the invention, the position limiting element includes a main body, a first limiting portion and a second limiting portion. The main body includes an expansion hole and a saddle portion located on an inner wall of the expansion hole. The grip is located in the expansion hole. The saddle portion divides the expansion hole into a first part and a second part. The first limiting portion extends from the main body to the receptacle while the second limiting portion extends from the main body to the spring clamp. When the plug is connected to the receptacle, the first limiting portion leans against the plug while the second limiting portion leans against the spring clamp.

In an embodiment of the invention, the position limiting element further includes two hooks respectively disposed on the main body and the second limiting portion. The hooks penetrate the housing to be locked on the housing.

Based on the above, in the aforesaid embodiments of the invention, the power device causes the position limiting element to interfere the spring clamp and the plug at the same time when the plug is inserted into the receptacle by means of the security configuration formed by installation of the position limiting element on the housing and location of the position limiting element between the receptacle and the spring clamp. The power device is not removed from the chassis discretionarily by pressing the spring clamp while the power device is in operation. Accidents and damage caused by the power device due to power outage are prevented.

Embodiments are illustrated with reference to accompanying drawings in detail below to make the aforementioned features and advantages of the invention more comprehensible.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF EMBODIMENTS

Figure 1:
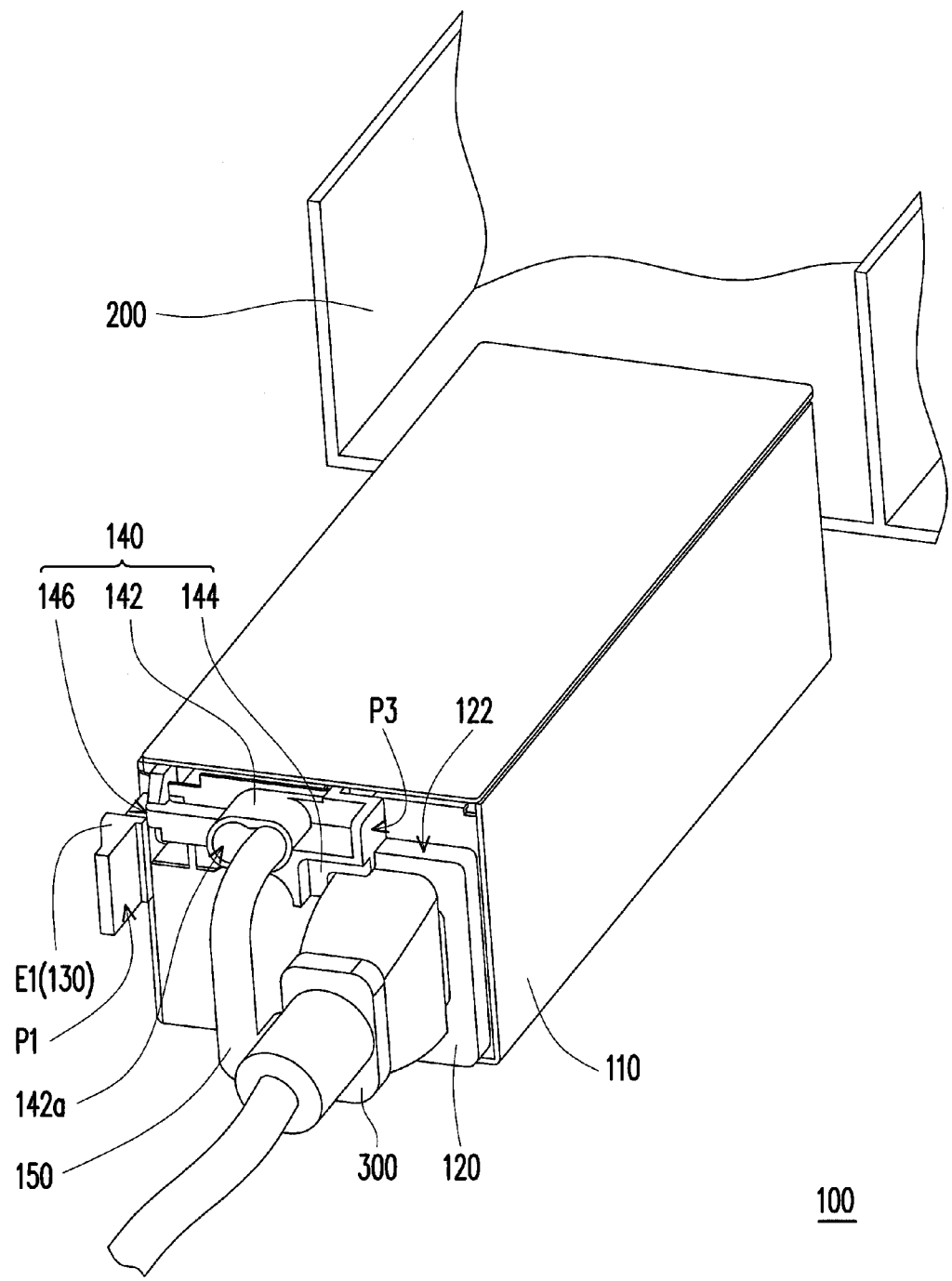
FIG. 1 is a schematic view showing a power device in a first status according to an embodiment of the invention.
Figure 2:
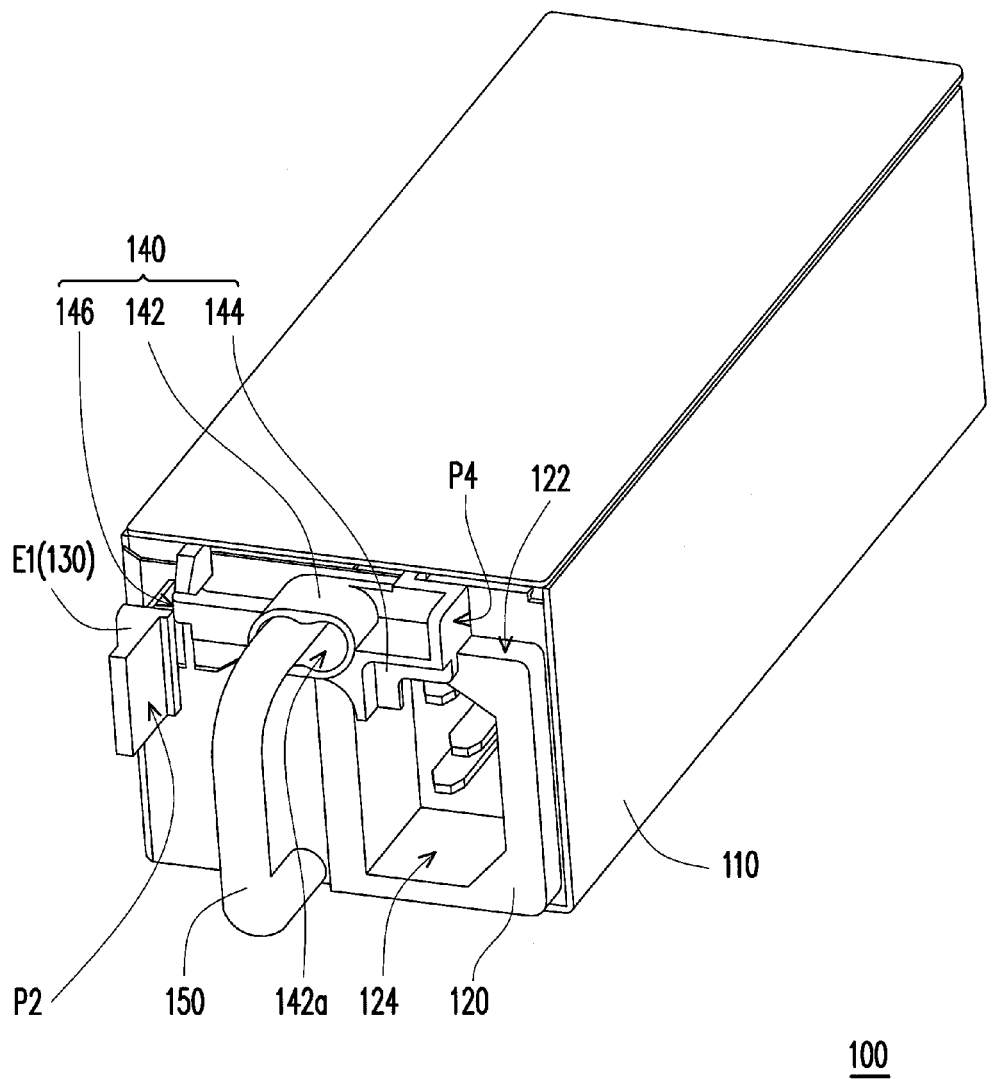
FIG. 2 is a schematic view showing the power device of FIG. 1 in a second status according to an embodiment of the invention.

FIG. 1 is a schematic view showing a power device in a first status according to an embodiment of the invention. FIG. 2 is a schematic view showing the power device of FIG. 1 in a second status according to an embodiment of the invention. Referring to FIG. 1 and FIG. 2 simultaneously, a power device 100 is suited for being assembled in a chassis 200 and connected with a plug 300 in the present embodiment. The power device 100 includes a housing 110 on which a receptacle 120, a spring clamp 130 and a position limiting element 140 are disposed. The plug 300 is removably connected to the receptacle 120 to transmit power of an external power supply (not shown) to the power device 100 and then transmit power of the power device 100 to an electronic device (not shown) disposed in the chassis 200. The housing 110 is locked on the chassis 200 by the spring clamp 130. Furthermore, the spring clamp 130 includes a moving end E1 and the position limiting element 140 is located between the moving end E1 of the spring clamp 130 and the receptacle 120. The moving end E1 of the spring clamp 130 moves between a first position P1 (as shown in FIG. 1) and a second position (as shown in FIG. 2) and the moving end E1 simultaneously drives the position limiting element 140 to move between a third position P3 (as shown in FIG. 1) and a fourth position P4 (as shown in FIG. 2) as relative to the housing 110.

In the present embodiment, the first position P1 and the second position P2 of the moving end E1 and the third position P3 and the fourth position P4 of the position limiting element 140 are essentially on a same path. Therefore, when the plug 300 is connected to the receptacle 120, the plug 300 essentially blocks the motion path of the position limiting element 140 between the third position P3 and the fourth position P4. In other words, when the plug 300 is connected to the receptacle 120 as shown in FIG. 1, the plug 300 simultaneously blocks the position limiting element 140 and the moving end E1 of the spring clamp 130 to constrain the position limiting element 140 at the third position P3 and constrain the moving end E1 of the spring clamp 130 at the first position P1.

Accordingly, the power device 100 is taken from the chassis 200 as people inadvertently touch the moveable end E1 of the spring clamp 130 at the same time when the power device 100 accepts/provides power, which is avoidable by constraining the moving end E1 of the spring clamp 130 at the first position P1. As a result, power outage is prevented from causing damage to the power device 100 and the electronic device in the chassis 200 effectively.

Figure 3:
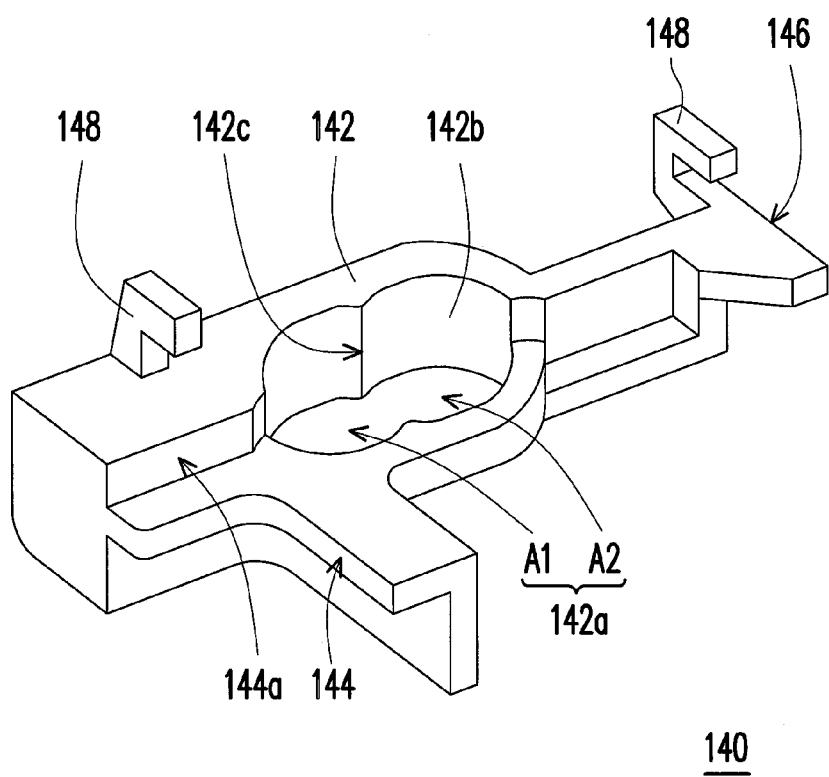
FIG. 3 is schematic view of a position limiting element in the power device from another perspective.

FIG. 3 is schematic view of the position limiting element in the power device from another perspective. Referring to FIGS. 1-3 simultaneously, in detail, the power device 100 further includes a grip 150 which is disposed on the housing 110 and the position limiting element 140 is movably sleeved on the grip 150. The position limiting element 140 includes a main body 142, a first limiting portion 144 and a second limiting portion 146. The main body 142 includes an expansion hole 142a and a saddle portion 142c located on an inner wall 142b of the expansion hole 142a. The grip 150 is located in the expansion hole 142. The saddle portion 142c divides the expansion hole 142a into a first element A1 and a second element A2 so that the position limiting element 140 switches between the third position P3 and the fourth position P4 by means of the first part A1 and the second part A2 as relative to the grip 150. In contrast, the position limiting element 140 causes the grip 150 to switch between the first element A1 and the second element A2 by configuration restrictions of the expansion hole 142a.

Furthermore, the first limiting portion 144 extends from the main body 142 to the receptacle 120 while the second limiting portion 146 extends from the main body 142 to the spring clamp 130. Accordingly, the first limiting portion 144 leans against the plug 300 and the position limiting element 140 is constrained at the third position P3 by the plug 300 when the plug 300 is connected to the receptacle 120. Further, the second limiting portion 146 leans against the moving end E1 at the same time to constrain the spring clamp 130 at the first position P1.

It should be noted that when the plug 300 is removed from the receptacle 120, the moving end E1 which pushes the spring clamp 130 jointly drives the position limiting element 140 to move from the third position P3 to the fourth position P4. When the position limiting element 140 arrives at the fourth position P4, the first limiting portion 144 is essentially in front of an entrance 124 of the receptacle 120. As a result, the first limiting portion 144 blocks the plug 300 from being inserted into the receptacle 120.

Based on the above, the removable position limiting element 140 is disposed between the spring clamp 130 and the receptacle 120 in the invention, with the result that the power device 100 has a foolproof function. The power device 100 simply operates alternatively in function modes, i.e. inserting the plug 300 to provide power or being removed from the chassis 200 by the spring clamp 130 to equip the power device 100 with a simple and effective protection mechanism.

On the other hand, the first limiting portion 144 includes a first supporting surface 144a while the receptacle 120 includes a second supporting surface 122 which protrudes from the housing 110. Moreover, the position limiting element 140 also includes two hooks 148 respectively disposed on the main body 142 and the second limiting portion 146. The hooks 148 respectively extend from the main body 142 and the second limiting portion 146 and penetrate the housing 110 are locked on the housing 110 to serve as auxiliary structures for the position limiting element 140 to be moveably disposed on the housing 110.

In summary, in the aforesaid embodiments of the invention, the power device causes the plug to block the position limiting element and the spring clamp at the same time when the plug is inserted into the receptacle by means of the security configuration formed by installation of the position limiting element on the housing and location of the position limiting element between the receptacle and the spring clamp. The power device is not removed from the chassis discretionarily by pressing the spring clamp while the power device is in operation. Accidents and damage caused by the power device due to power outage are prevented.

Furthermore, when the plug is removed from the receptacle, the position limiting element is transposed to the fourth position as the spring clamp is pushed. The plug is not inserted into the receptacle at this moment since the first limiting portion blocks in front of the entrance of the receptacle. The power device merely carries out the function of being removed from the chassis. As a result, the power device only operates alternatively as in the two cases mentioned above to establish the protection mechanism of the power device.

Though the above embodiments have disclosed the invention, they are not intended to limit the invention. Modifications and alterations may be made by one of ordinary skill in the art without departing from the spirit and scope of the invention. Therefore, the protection scope of the invention falls in the appended claims.

What is claimed is:

1. A power device suited for suited for being assembled in a chassis and connected with a plug, comprising:
   a housing;
   a receptacle disposed on the housing and the plug is removably connected thereto;
   a spring clamp disposed on the housing and comprising a moving end; and
   a position limiting element disposed on the housing and located between the spring clamp and the receptacle, the position limiting element and the moving end of the spring clamp linked together to move between a first position and a second position as relative to the housing, and the plug blocking the position limiting element and the moving end to constrain the spring clamp at the first position when the plug is connected to the receptacle.

2. The power device according to claim 1, when the moving end of the spring clamp moves from the first position to the second position, the moving end drives the position limiting element to move from a third position to a fourth position, and when the plug is connected to the receptacle, the plug constrains the position limiting element at the third position.

3. The power device according to claim 2, wherein the first position and the second position of the moving end and the third position and the fourth position of the position limiting element are on a same path, and the plug blocks in the path between the third position and the fourth position of the position limiting element when the plug is connected to the receptacle.

4. The power device according to claim 2, further comprising:
   a grip disposed on the housing and on which the position limiting element movably sleeved.

5. The power device according to claim 4, wherein the position limiting element comprises:
   a main body comprising an expansion hole and a saddle portion located on an inner wall of the expansion hole, the grip located in the expansion hole, the saddle portion dividing the expansion hole into a first part and a second part to cause the position limiting element to switch between the third position and the fourth position by means of the first part and the second part as relative to the grip,
   a first limiting portion extending from the main body to the receptacle; and
   a second limiting portion extending from the main body to the spring clamp, and when the plug is connected to the receptacle, the first limiting portion leans against the plug and the second limiting portion leans against the spring clamp.

6. The power device according to claim 5, wherein, when the plug is removed from the receptacle and the spring clamp drives the position limiting element to move to the fourth position, the first limiting portion is in front of an entrance of the receptacle to block the plug from being inserted into the receptacle.

7. The power device according to claim 5, wherein the first limiting portion comprises a first supporting surface while the receptacle comprises a second supporting surface protruding from the housing, and the position limiting element leans against the second supporting surface of the receptacle and the grip by the first supporting surface and the inner wall of the expansion hole.

8. The power device according to claim 5, wherein the position limiting element further comprises:
   two hooks respectively disposed on the housing and the second limiting portion and penetrating the housing to be locked on the housing.

\* \* \* \* \*